United States Patent
Matsuura

(10) Patent No.: US 9,390,781 B2
(45) Date of Patent: Jul. 12, 2016

(54) SEMICONDUCTOR DEVICE AND METHOD FOR MANUFACTURING SEMICONDUCTOR DEVICE

(71) Applicant: FUJITSU SEMICONDUCTOR LIMITED, Yokohama-shi, Kanagawa (JP)

(72) Inventor: Osamu Matsuura, Kuwana (JP)

(73) Assignee: FUJITSU SEMICONDUCTOR LIMITED, Yokohama, Kanagawa (JP)

( * ) Notice: Subject to any disclaimer, the term of this patent is extended or adjusted under 35 U.S.C. 154(b) by 0 days.

(21) Appl. No.: 14/464,952

(22) Filed: Aug. 21, 2014

(65) Prior Publication Data

US 2015/0060969 A1 Mar. 5, 2015

(30) Foreign Application Priority Data

Aug. 29, 2013 (JP) ................................. 2013-178209

(51) Int. Cl.
*H01L 21/02* (2006.01)
*G11C 11/22* (2006.01)
*H01L 29/51* (2006.01)
*H01L 27/115* (2006.01)

(52) U.S. Cl.
CPC ........ *G11C 11/221* (2013.01); *H01L 27/11507* (2013.01); *H01L 29/516* (2013.01); *H01L 27/11502* (2013.01); *H01L 27/11509* (2013.01); *H01L 2924/1441* (2013.01)

(58) Field of Classification Search
CPC ............ G11C 11/221; H01L 27/11507; H01L 27/11502; H01L 27/11509; H01L 29/516; H01L 2924/1441
See application file for complete search history.

(56) References Cited

U.S. PATENT DOCUMENTS

| 2002/0063271 A1* | 5/2002 | Kim ............................. 257/295 |
| 2003/0178659 A1* | 9/2003 | Kato ............................ 257/296 |
| 2004/0152258 A1* | 8/2004 | Kiyotoshi ........... H01L 21/8221 438/253 |
| 2005/0087788 A1* | 4/2005 | Kutsunai ........... H01L 21/28568 257/306 |
| 2008/0076192 A1* | 3/2008 | Hidaka ................. H01L 27/105 438/3 |

FOREIGN PATENT DOCUMENTS

JP 7-202138 A 8/1995

* cited by examiner

*Primary Examiner* — Su C Kim
(74) *Attorney, Agent, or Firm* — Westerman, Hattori, Daniels & Adrian, LLP

(57) ABSTRACT

A semiconductor device includes a transistor formed on a semiconductor substrate, a first insulation film formed above the semiconductor substrate, and first and second capacitors located on the first insulation film. The first capacitor includes a lower electrode, a ferroelectric, and an upper electrode. One of the lower electrode and the upper electrode is connected to an impurity region of the transistor. The second capacitor includes a first electrode, a first dielectric, a second electrode, a second dielectric, and a third electrode. The lower electrode is formed from the same material as the first electrode, the ferroelectric is formed from the same material as the first dielectric, and the upper electrode is formed from the same material as the second electrode.

10 Claims, 13 Drawing Sheets

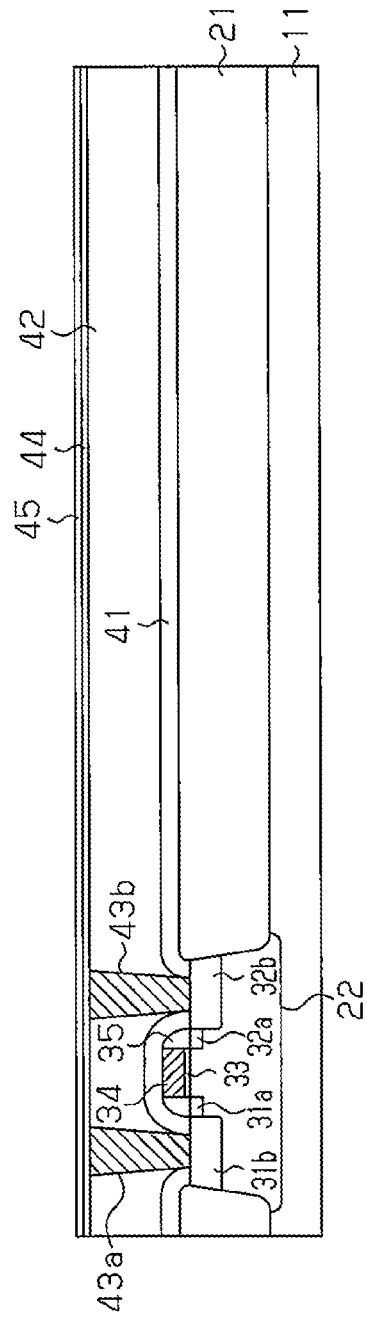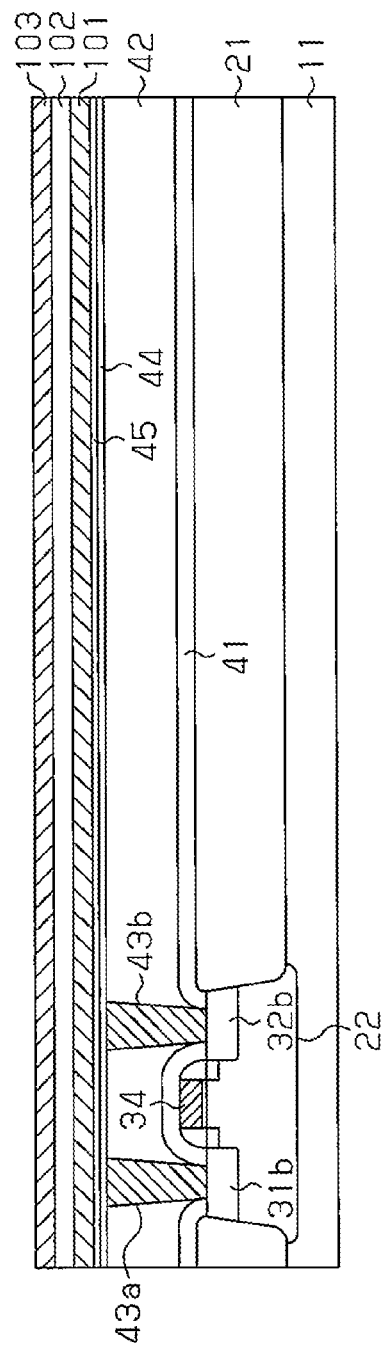

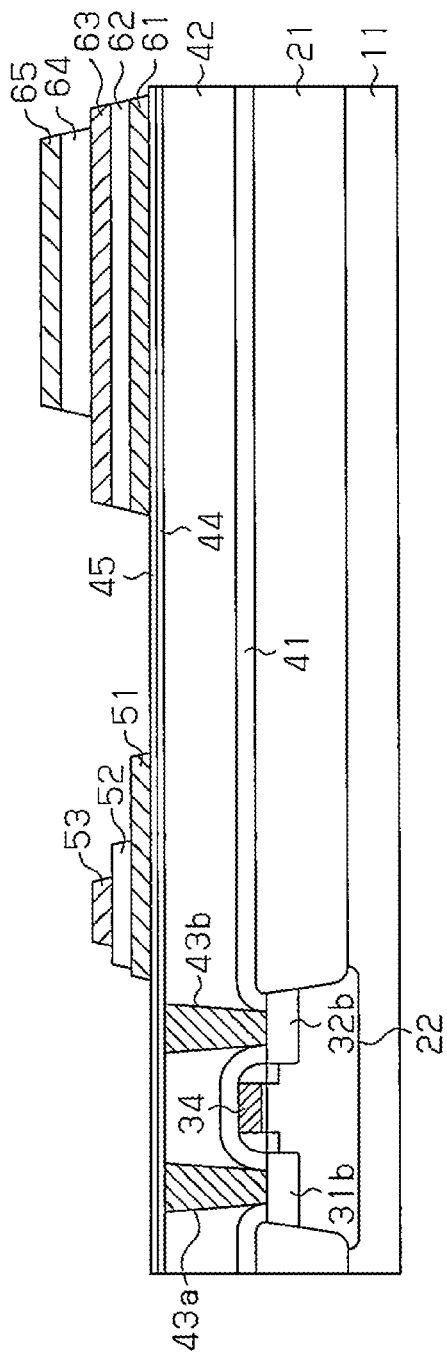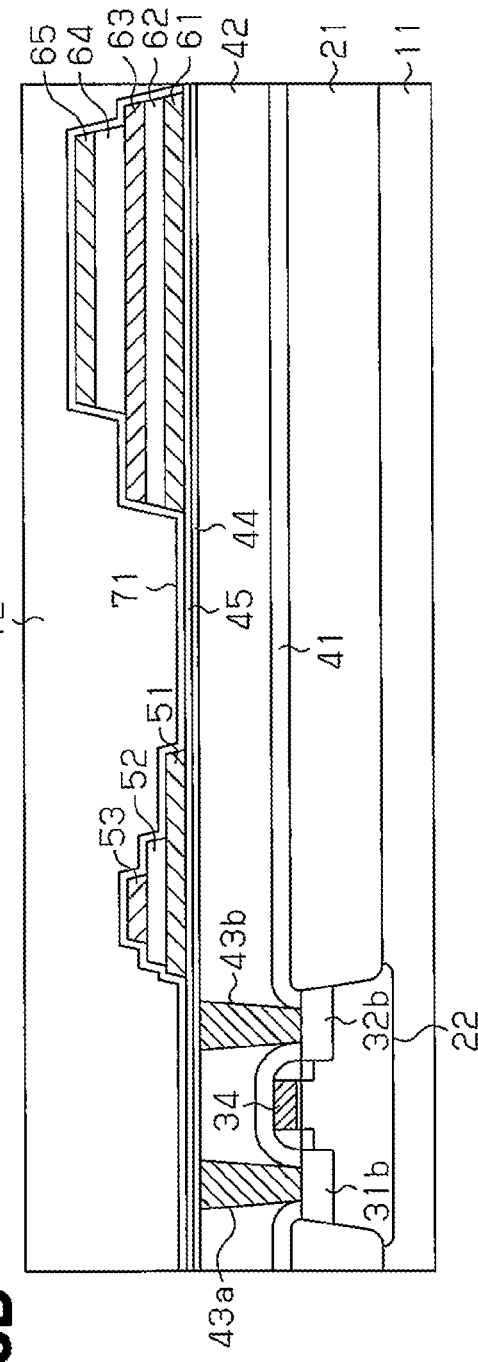

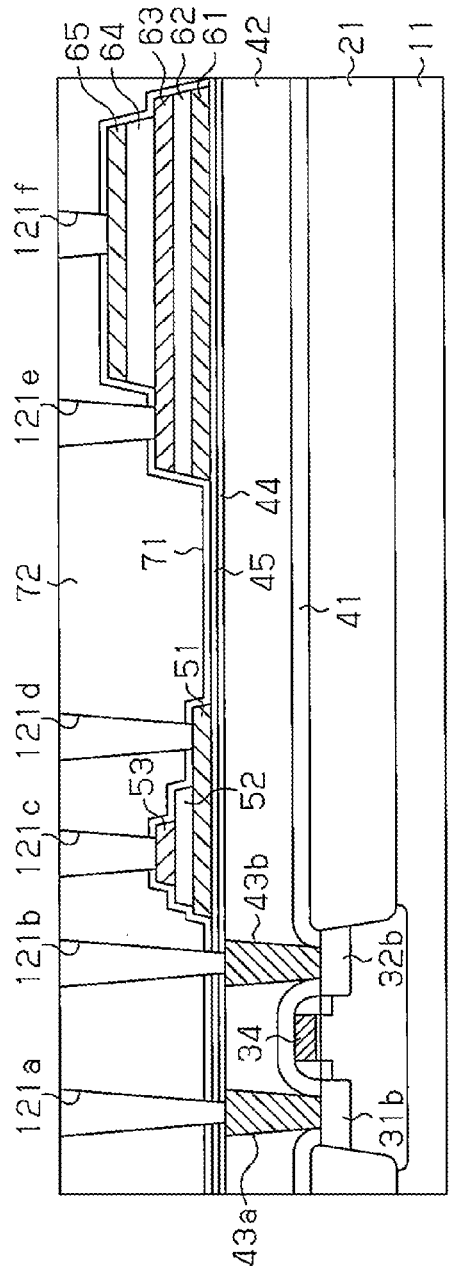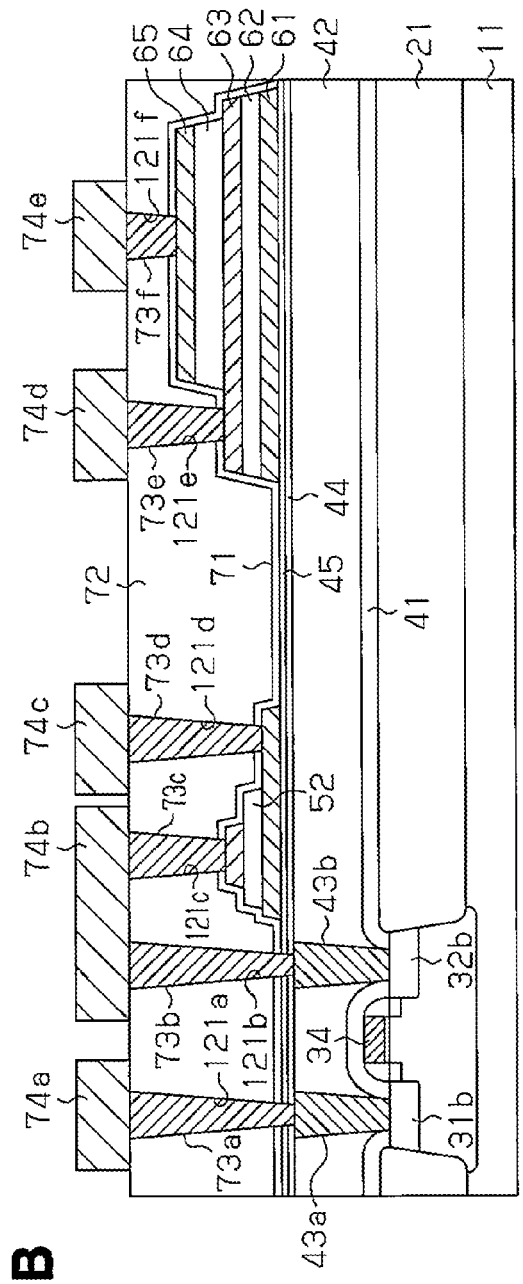

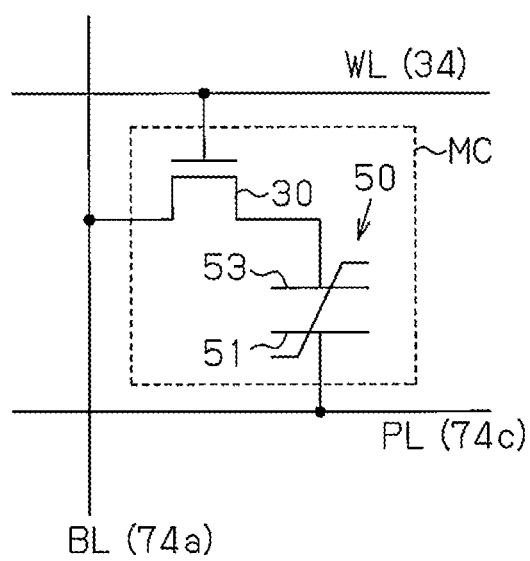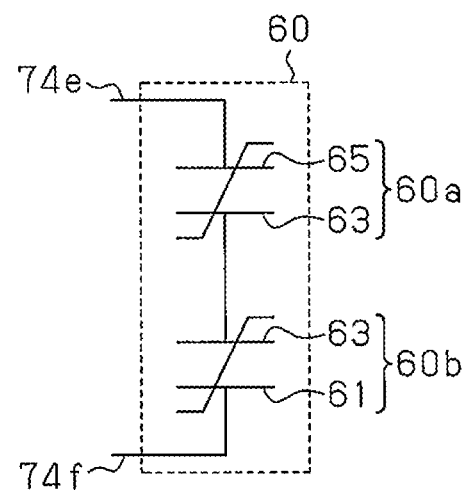

SEMICONDUCTOR DEVICE AND METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2013-178209, filed on Aug. 29, 2013, the entire contents of which are incorporated herein by reference.

FIELD

This disclosure relates to a semiconductor device and a method for manufacturing a semiconductor device.

BACKGROUND

A semiconductor memory such as a ferroelectric memory includes a cell capacitor that stores information as charge (Japanese Laid-Open Patent Publication No. 7-202138). A cell capacitor of a ferroelectric memory includes two electrodes and a dielectric film located between the electrodes. The dielectric film is ferroelectric (spontaneously polarized).

A semiconductor device including logic units and memory units is provided with a capacitor, the application of which differs from the cell capacitor. For example, the semiconductor device includes a smoothening capacitor connected between two wires that supply operational power. A ferroelectric is used as such a smoothening capacitor. A smoothening capacitor using a ferroelectric has a higher capacitance per unit area (relative permittivity) than a capacitor using a dielectric such as silicon oxide or silicon nitride.

SUMMARY

It is preferred that the ferroelectric used in cell capacitors of a ferroelectric memory be thin to allow for low voltage operation. However, when the ferroelectric film of the smoothening capacitor is thin, the withstand voltage decreases, and the time dependent dielectric breakdown (TDDB) of the insulation film is adversely affected.

One aspect of this disclosure is a semiconductor device including a semiconductor substrate, a transistor, a first insulation film formed above the semiconductor substrate, a first capacitor located on the first insulation, and a second capacitor located on the first insulation film. The transistor includes an impurity region formed in the semiconductor substrate, a gate insulation film located on the semiconductor substrate, and a gate electrode located on the gate insulation film. The first capacitor includes a lower electrode, a ferroelectric, and an upper electrode. One of the lower electrode and the upper electrode is connected to the impurity region. The second capacitor includes a first electrode, a first dielectric, a second electrode, a second dielectric, and a third electrode. The lower electrode and the first electrode are formed from the same material, the ferroelectric and the first dielectric are formed from the same material, and the upper electrode and the second electrode are formed from the same material.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The embodiment, together with objects and advantages thereof, may best be understood by reference to the following description of the presently preferred embodiments together with the accompanying drawings in which:

FIGS. 6A, 6B, 7A, 7B, 8A, 8B, 9A, and 9B are cross-sectional views illustrating a process for manufacturing the semiconductor device of FIG. 1;

FIG. 11A is a circuit diagram of a memory cell in the semiconductor device of FIG. 10;

FIG. 11B is a circuit diagram of a capacitor cell in the semiconductor device of FIG. 10;

DESCRIPTION OF THE EMBODIMENTS

Various embodiments will now be described with reference to the drawings. The embodiments are illustrated by way of example and are not limited by the accompanying figures, in which like references indicate similar elements. Elements in the figures are illustrated for simplicity and clarity and have not necessarily been drawn to scale. To facilitate understanding, hatching lines may not be illustrated in the cross-sectional drawings.

Figure 1:
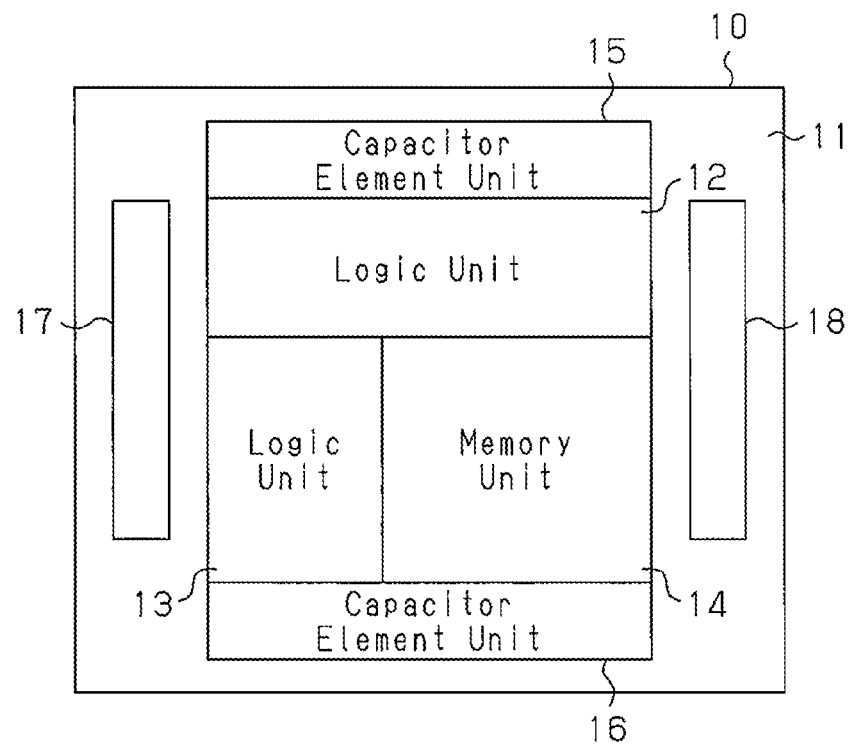
FIG. 1 is a schematic diagram of a semiconductor device.

Referring to FIG. 1, the semiconductor device 10 is a logic-mixed memory that uses a semiconductor substrate 11. On the semiconductor substrate 11, the semiconductor device 10 includes logic units 12 and 13, a memory unit 14, capacitor element units 15 and 16, and input/output units 17 and 18.

Each of the logic units 12 and 13 includes, for example, a CPU or a processing circuit that performs a given process. The logic units 12 and 13 are capable of accessing the memory unit 14. Each of the logic units 12 and 13 is capable of accessing an external device, which is coupled to the semiconductor device 10 through the input/output units 17 and 18.

The memory unit 14 is, for example, a ferroelectric memory and includes a plurality of memory cells. Each memory cell includes a capacitor (hereafter, referred to as the cell capacitor) that stores information as charge. A ferroelectric film is used as the cell capacitor.

Each of the capacitor element units 15 and 16 includes a capacitor (hereafter, referred to as the ferroelectric capacitor) that includes a ferroelectric film. The ferroelectric capacitor is used to supply, for example, the logic units 12 and 13 and the memory unit 14 with stabilized (smoothened) power supply voltage.

Figure 3:
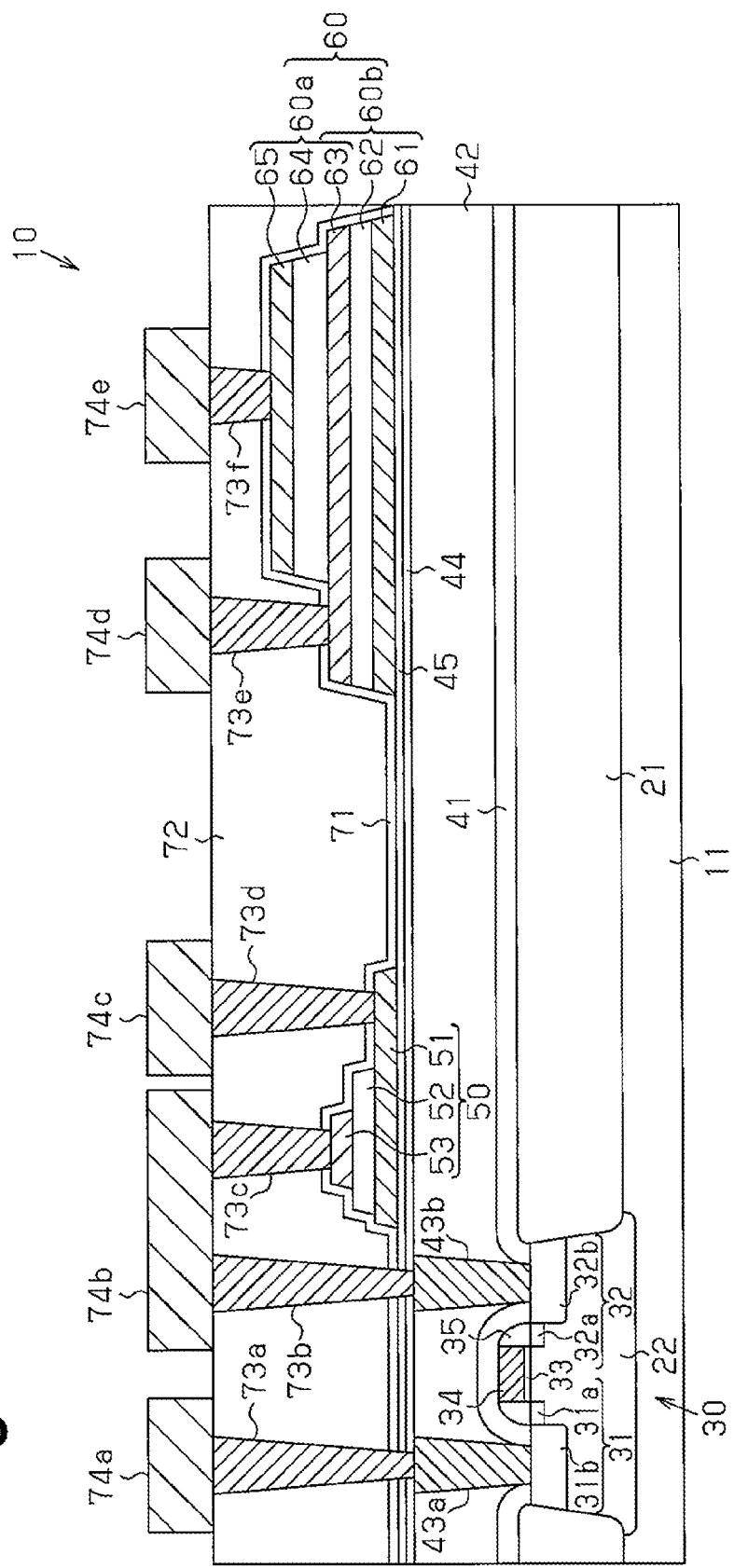
FIG. 3 is a schematic partial cross-sectional view of the semiconductor device illustrated in FIG. 1.

FIG. 3 is a schematic cross-sectional view of the semiconductor device 10. In FIG. 3, the left side illustrates a memory cell of the memory unit 14 illustrated in FIG. 1, and the right side illustrates a capacitor cell of each of the capacitor element units 15 and 16 illustrated in FIG. 1.

As illustrated in FIG. 3, an element isolation film 21 is formed in a given region of the semiconductor substrate 11. For example, the semiconductor substrate 11 is a silicon substrate, and the element isolation film 21 is an oxide silicon film. The element isolation film 21 defines an active region in the semiconductor substrate 11. The active region includes a p-well 22, which is formed by injecting a p-type impurity such as boron (B) to the active region. The active region (p-well 22) includes a transistor 30. The transistor 30 includes a gate electrode 34, a gate insulation film 33, and impurity regions 31 and 32. The impurity region 31 includes a low-concentration impurity region 31a and a high-concentration impurity region 31b. In the same manner, the impurity region 32 includes a low-concentration impurity region 32a and a high-concentration impurity region 32b.

Side walls 35 are formed on the two sides of the gate electrode 34. An insulation film 41 (stopper layer) covers the gate electrode 34, the side walls 35, and the element isolation film 21. The insulation film 41 is, for example, a silicon oxynitride (SiON) film.

An interlayer insulation film 42 is formed on the transistor 30 and the element isolation film 21. The interlayer insulation film 42 has a smoothened upper surface. The interlayer insulation film 42 is one example of a first insulation film.

The interlayer insulation film 42 includes conductive plugs 43a and 43b extending from the upper surface of the interlayer insulation film 42 to the impurity regions 31b and 32b. The conductive plugs 43a and 43b are, for example, tungsten plugs. Further, the conductive plugs 43a and 43b include barrier films (not illustrated).

An anti-oxidation film 44 is formed on the interlayer insulation film 42 and the conductive plugs 43a and 43b. The anti-oxidation film 44 includes, for example, a silicon oxynitride (SiON) film and a silicon oxide film (SiO).

A protection film 45 is formed on the anti-oxidation film 44. The protection film 45 is formed from, for example, alumina ($Al_2O_3$). The protection film 45 has a thickness of, for example, 20 nm. Hydrogen and moisture from the interlayer insulation film 42 does not enter the ferroelectric capacitors and the cell capacitors due to the protection film 45.

A cell capacitor 50 of a memory cell is formed in a given region on the protection film 45. The cell capacitor 50 includes a lower electrode 51, a ferroelectric 52, and an upper electrode 53, which are stacked in this order on the protection film 45.

The lower electrode 51 extends toward the outer side (right side as viewed in FIG. 3) from an end of the ferroelectric 52. The lower electrode 51 is formed from, for example, platinum (Pt). The lower electrode 51 has a thickness of, for example, 150 nm.

The ferroelectric 52 is formed from a ferroelectric material including a perovskite structure, for example, lead zirconate titanate (PZT). The ferroelectric 52 has a thickness of, for example, 100 nm. The ferroelectric 52 may be formed from PLCSZT, which is obtained by adding lanthanum (La), calcium (Ca), and strontium (Sr) to PZT.

The upper electrode 53 is formed from, for example, iridium oxide ($IrO_2$). The upper electrode 53 has a thickness of, for example, 250 nm.

A capacitor cell 60 is formed in another given region on the protection film 45, for example, in a region above the element isolation film 21.

The capacitor cell 60 includes a first electrode 61, a first dielectric 62, a second electrode 63, a second dielectric 64, and a third electrode 65, which are stacked in this order on the protection film 45. The second electrode 63 extends toward the outer side (left side as viewed in FIG. 3) from an end of the second dielectric 64.

The first electrode 61, the first dielectric 62, and the second electrode 63 are respectively formed from the same material as the lower electrode 51, the ferroelectric 52, and the upper electrode 53 of the cell capacitor 50. Further, the first electrode 61, the first dielectric 62, and the second electrode 63 respectively have the same thickness as the lower electrode 51, the ferroelectric 52, and the upper electrode 53 of the cell capacitor 50. Thus, the first electrode 61 is formed from, for example, platinum and has a thickness of, for example, 150 nm. The first dielectric 62 is formed from, for example, lead zirconate titanate (PZT) and has a thickness of, for example, 100 nm. The second electrode 63 is formed from iridium oxide and has a thickness of, for example, 250 nm.

The material and thickness of the second dielectric 64 is set in accordance with the application of the capacitor cell 60, for example, when used as a smoothening capacitor. For example, the second dielectric 64 is formed from lead zirconate titanate (PZT) and has a thickness of, for example, 140 nm.

The third electrode 65 is formed from, for example, iridium oxide ($IrO_2$) and has a thickness of, for example, 150 nm.

A protection film 71 covers the upper surfaces of the cell capacitor 50, the capacitor cell 60, and the protection film 45. The protection film 71 is formed from, for example, alumina and has a thickness of, for example, 20 nm.

An interlayer insulation film 72 is formed on the protection film 71. The interlayer insulation film 72 includes a flattened upper surface. The interlayer insulation film 72 includes conductive plugs 73a to 73f. The interlayer insulation film 72 is one example of a second insulation film.

The conductive plugs 73a and 73b extend from the upper surface of the interlayer insulation film 72 to the conductive plugs 43a and 43b.

The conductive plug 73c extends from the upper surface of interlayer insulation film 72 to the upper electrode 53. The conductive plug 73d extends from the upper surface of the interlayer insulation film 72 to the lower electrode 51 of the cell capacitor 50.

The conductive plug 73e extends from the upper surface of the interlayer insulation film 72 to the second electrode 63 of the capacitor cell 60. The conductive plug 73f extends from the upper surface of the interlayer insulation film 72 to the third electrode 65 of the capacitor cell 60. In the present embodiment, the first electrode 61 of the capacitor cell 60 is not connected to any conductive plug.

The conductive plugs 73a to 73e each include, for example, a barrier film, which covers the wall of a contact hole, and a conductive material. The contact hole is filled with the conductive material inside the barrier film. The barrier film is formed from, for example, titanium (Ti) or titanium nitride (TiN). The conductive material is, for example, tungsten (W).

Wires 74a to 74e are formed on the interlayer insulation film 72. The wire 74a is electrically connected to the conductive plug 73a. The wire 74b electrically connects the conductive plug 73b to the conductive plug 73c. The wire 74c is electrically connected to the conductive plug 73d. The wires 74d and 74e are electrically connected to the conductive plugs 73e and 73f, respectively. The wires 74a to 74e are formed from, for example, aluminum (Al) or an aluminum alloy.

The conductive plugs 73a and 43a electrically connect the wire 74a to the impurity region 31b of the transistor 30. The conductive plugs 73b and 43b electrically connect the wire 74b to the impurity region 32b of the transistor 30. Further, the conductive plug 73c electrically connects the wire 74b to the upper electrode 53 of the cell capacitor 50. Accordingly, the upper electrode 53 of the cell capacitor 50 is electrically connected to the impurity region 32b of the transistor 30. The conductive plug 73d electrically connects the wire 74c to the lower electrode 51 of the cell capacitor 50.

The conductive plug 73e electrically connects the wire 74d to the second electrode 63 of the capacitor cell 60. The conductive plug 73f electrically connects the wire 74e to the third electrode 65 of the capacitor cell 60.

Figure 2A:
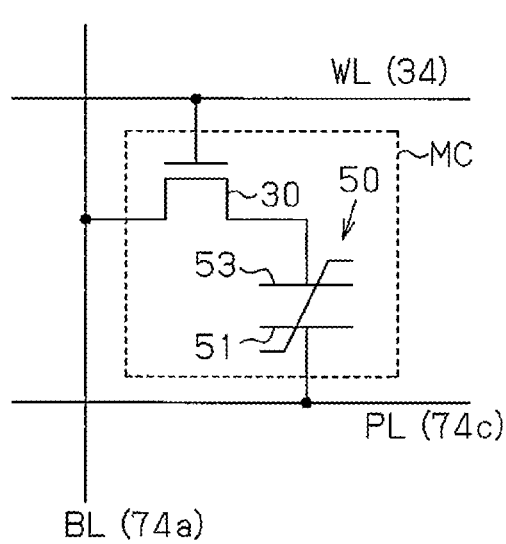
FIG. 2A is a circuit diagram of a memory cell.

FIG. 2A is a circuit diagram of a memory cell MC, which includes the transistor 30 and the cell capacitor 50. The transistor 30 is, for example, an n-channel MOS transistor. The transistor 30 includes a gate terminal connected to a word line WL, a first terminal (source terminal or drain terminal) connected to a bit line BL, and a second terminal (drain terminal or source terminal) connected to the cell capacitor 50.

The word line WL is, for example, the gate electrode 34 illustrated in FIG. 3. The bit line BL is, for example, the wire 74a illustrated in FIG. 3. In FIG. 3, a wire that functions as the word line WL may be formed in a layer above the transistor 30, for example, in the same layer as the wire 74a. A conductive plug may be formed to connect the wire (word line WL) to the gate electrode 34. Further, in FIG. 3, a wire that functions as the bit line BL may be formed in the same layer as the wire 74a or in a layer above the wire 74a. A conductive plug may be formed to connect the wire (bit line BL) to the wire 74a.

The cell capacitor 50 includes a ferroelectric (ferroelectric 52 of FIG. 3) located between the upper electrode 53 and the lower electrode 51. The upper electrode 53 is connected to the second terminal of the transistor 30. The lower electrode 51 is connected to a plate line PL. The plate line PL is, for example, the wire 74c illustrated in FIG. 3. In FIG. 3, a wire that functions as the plate line PL may be formed in the same layer as the wire 74c or in a layer above the wire 74c to function as the plate line PL. A conductive plug may be formed to connect the wire (plate line PL) to the wire 74c.

Figure 2B:
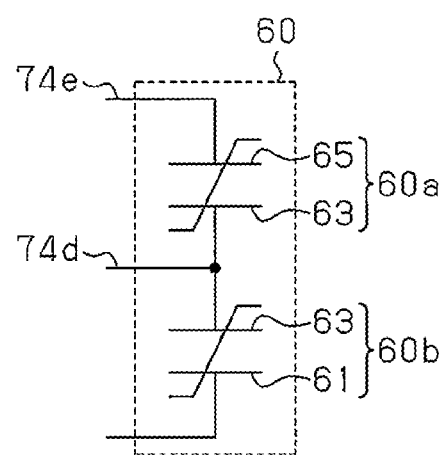
FIG. 2B is a circuit diagram of a capacitor cell.

FIG. 2B is a circuit diagram of the capacitor cell 60, which includes two ferroelectric capacitors 60a and 60b. The ferroelectric capacitor 60a includes the second electrode 63, the second dielectric 64 (refer to FIG. 3), and a third electrode 65. The wire 74e, which is connected to the third electrode 65 of the ferroelectric capacitor 60a, is a power line that supplies, for example, low potential voltage to the memory unit 14 and the logic units 12 and 13 illustrated in FIG. 1. The wire 74d, which is connected to the second electrode 63 of the ferroelectric capacitor 60a, is a power line that supplies, for example, high potential voltage to the memory unit 14 and the logic units 12 and 13 illustrated in FIG. 1. Accordingly, in the capacitor cell 60, the ferroelectric capacitor 60a connected between the wires 74e and 74d functions as a smoothening capacitor that stabilizes the high potential voltage and the low potential voltage.

The ferroelectric capacitor 60b includes the first electrode 61, the first dielectric 62 (refer to FIG. 3), and the second electrode 63. The second electrode 63 of the ferroelectric capacitor 60a is connected to the wire 74d. The first electrode 61 of the ferroelectric capacitor 60b is not connected to any wire. That is, the first electrode 61 is unconnected. Accordingly, the ferroelectric capacitor 60b is not used in the capacitor cell 60 of FIGS. 2B and 3. In the present embodiment, the ferroelectric capacitor 60b is formed as a dummy.

The operation of the semiconductor device 10 will now be described.

Figure 4:
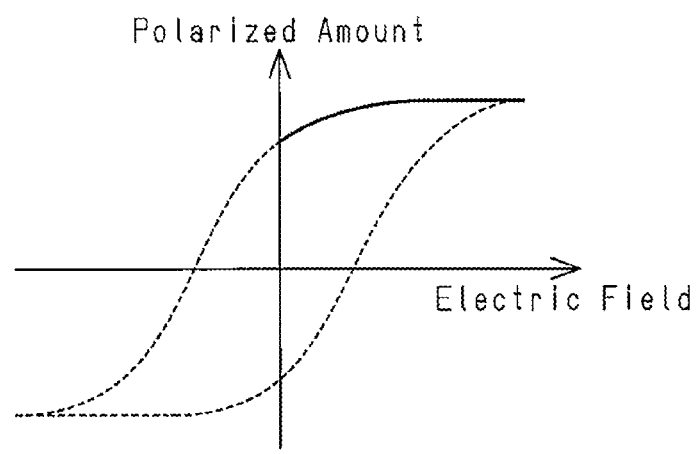
FIG. 4 is a graph illustrating the electric field-polarization characteristics of a ferroelectric.

As illustrated in FIG. 4, in a ferroelectric capacitor, the relationship of the applied voltage (electric field) and the polarized amount forms a hysteresis curve. In other words, the ferroelectric capacitor has hysteresis characteristics. Thus, even when the applied voltage is 0 V after voltage is applied to one of the electrodes, the ferroelectric capacitor maintains a condition in which a positive polarization amount is held or a condition in which a negative polarization amount is held. The memory cell MC stores the information of "1" and "0" using such two polarized conditions. The capacitor cell 60 connected between the two power lines uses the ferroelectric component illustrated by the solid line in FIG. 4.

Figure 5:
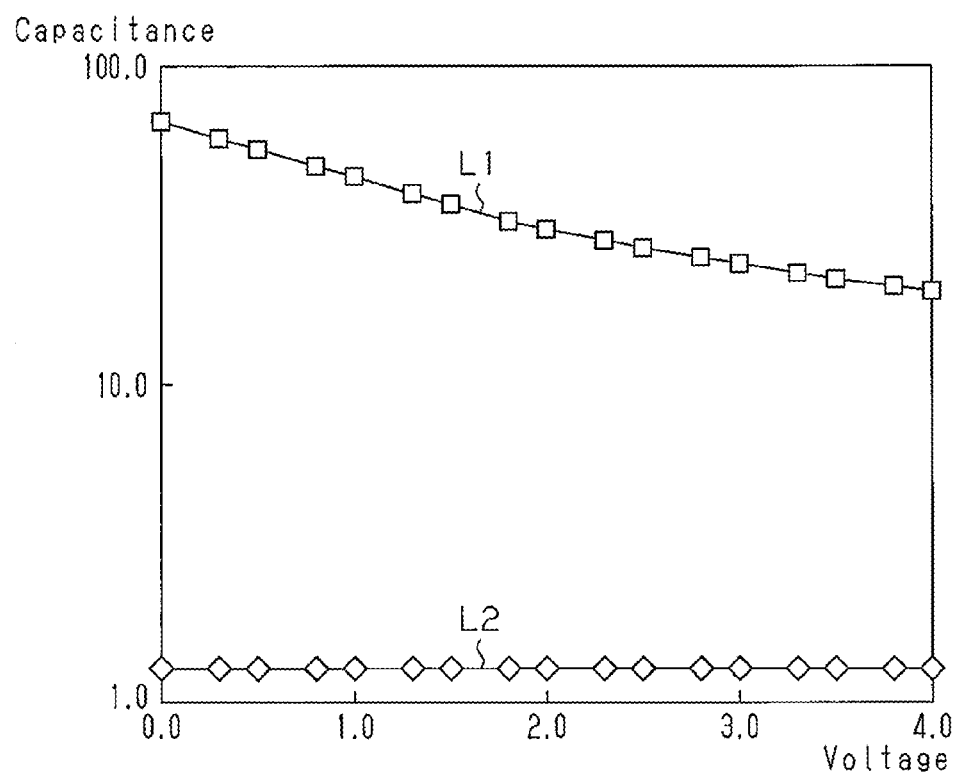
FIG. 5 is a graph illustrating the voltage-capacitance characteristics of a ferroelectric capacitor.

In FIG. 5, curve L1 indicates the voltage dependency of the capacitance of a ferroelectric capacitor, and curve L2 indicates the voltage dependency of a capacitor having a poly-insulator-poly (PIP) structure. In FIG. 5, the horizontal axis represents the voltage (V), and the vertical axis represents the capacitance per unit area (fF/µm$^2$) in logarithm.

Referring to FIG. 5, the use of a ferroelectric obtains a capacitor having a larger capacitance than a capacitor having a PIP structure. This allows the chip size to be significantly reduced as compared with when using a capacitor having a PIP structure.

As illustrated in FIG. 3, the capacitor cell 60 includes the first electrode 61, the first dielectric 62, the second electrode 63, the second dielectric 64, and the third electrode 65. In this structure, the conductive plugs 73e and 73f respectively connect the second electrode 63 and the third electrode 65 to the wires 74d and 74e to obtain the ferroelectric capacitor 60a. Thus, regardless of the thickness of the first dielectric 62, the thickness of the second dielectric 64 may be set as required.

The first dielectric 62 and the ferroelectric 52 of the cell capacitor 50 are simultaneously formed. Accordingly, the thickness of the first dielectric 62 is set to satisfy demands regarding the cell capacitor 50, for example, reduction in voltage. Thus, the cell capacitor 50 of the memory cell MC is applicable to reduced voltages. Even in this case, by setting the thickness of the second dielectric 64 as required, the capacitor cell 60 may be obtained including the ferroelectric capacitor 60a having a high withstand voltage and small leakage current.

With reference to FIGS. 6A to 9B, a method for manufacturing the semiconductor device 10 will now be described. Reference characters may be omitted from elements that are not included in the description of processes. First, the process performed to obtain the structure of FIG. 6A will be described.

The element isolation film 21 is formed in a given region of the semiconductor substrate 11 (silicon substrate). Local oxidation of silicon (LOCOS) or shallow trench isolation (STI) is performed to form the element isolation film 21. The element isolation film 21 defines a plurality of element regions in the surface of the semiconductor substrate 11.

Then, a p-type impurity is drawn into the element regions to form the p-well 22. The p-type impurity is, for example, boron (B). The p-well 22 is thermally oxidized to form the gate insulation film 33.

Then, the gate electrode 34 is formed from, for example, polysilicon. For example, chemical vapor deposition (CVD) is performed to form a polysilicon film entirely on the semiconductor substrate 11 (gate insulation film 33). Then, photolithography or etching is performed to pattern the polysilicon film and form the gate electrode 34 (polysilicon wire).

Then, using the gate electrode 34 as a mask, an n-type impurity is ion-injected into the p-well 22 at a shallow position with a low concentration to form the impurity regions 31a and 32a. The n-type impurity is, for example, phosphorus (P) or arsenic (As).

Then, the side walls 35 are formed on the two sides of the gate electrode 34. After performing CVD to form an insulation film entirely on the upper surface of the semiconductor substrate 11, the insulation film is etched back to form the side walls 35. The insulation film is, for example, $SiO_2$, SiN, or the like.

Using the gate electrode 34 and the side walls 35 as a mask, an n-type impurity is ion-injected to the p-well 22 with a high concentration to form the impurity regions 31b and 32b. The high-concentration ion injection of the n-type impurities forms the impurity regions 31b and 32b from the impurity regions 31a and 32a, excluding portions located below the side walls 35.

Preferably, a metal silicide layer is formed on the upper surface of the gate electrode 34 and the upper surfaces of the impurity regions 31b and 32b. The metal silicide layer is formed from, for example, cobalt silicide or titanium silicide.

Then, plasma CVD is performed to form the insulation film 41 entirely on the upper surface of the semiconductor substrate 11. The insulation film 41 is, for example, a silicon oxynitride (SiON) film and has a thickness of, for example, 200 nm. Plasma CVD is further performed to form the interlayer insulation film 42 on the insulation film 41. The interlayer insulation film 42 is an SiO film such as a tetra-ethyl-ortho-silicate non-doped silicate glass (TEOS-NSG) film. Subsequently, chemical mechanical polishing (CMP) is performed to flatten the surface of the interlayer insulation film 42.

Next, contact holes are formed extending from the upper surface of the interlayer insulation film 42 to the impurity regions 31b and 32b of each transistor. Then, sputtering is performed to form a barrier film (not illustrated) that entirely covers the upper surface of the semiconductor substrate 11 and the walls defining the contact holes. For example, the barrier film has a double-layer structure including a titanium (Ti) layer having a thickness of 30 nm and a titanium nitride (TiN) layer having a thickness of 20 nm.

Then, CVD is performed to deposit tungsten entirely on the upper surface of the semiconductor substrate 11 and fill the contact holes with tungsten. Subsequently, CMP is performed to remove the tungsten and the barrier film from the interlayer insulation film 42 and expose the interlayer insulation film 42. As a result, the tungsten remaining in the contact holes form the conductive plugs 43a and 43b that electrically connect the impurity regions 31b and 32b to wires of an upper layer.

Subsequently, the anti-oxidation film 44 is formed on the interlayer insulation film 42 and the conductive plugs 43a and 43b. The anti-oxidation film 44 is formed by performing, for example, CVD. Further, the anti-oxidation film 44 has a double-layer structure including an $SiO_2$ film having a thickness of 130 nm and an SiON film having a thickness of 100 nm.

Then, the protection film 45 is formed on the anti-oxidation film 44. The protection film 45 is formed by sputtering, for example, alumina ($Al_2O_3$) and has a thickness of, for example, 20 nm.

The process performed to obtain the structure of FIG. 6B will now be described.

After forming the protection film 45 as described above, for example, physical vapor deposition (PVD) is performed to deposit platinum (Pt) having a thickness of 150 nm on the protection film. This forms a conductive film 101.

Then, for example, PVD is performed to deposit PLCSZT (PZT to which La, Ca, and Sr are added) on the conductive film 101 and form a dielectric film 102. The dielectric film 102 has a thickness of, for example, 100 nm that is set in accordance with the characteristics of the cell capacitor 50 illustrated in FIG. 2A. Subsequently, rapid thermal annealing (RTA) is performed under an atmosphere containing oxygen to crystalize the dielectric film 102. Here, PLCSZT (PZT) is a representative ferroelectric material including a perovskite structure. However, the material of the dielectric film 102 is not particularly limited as long as the material has ferroelectric characteristics.

Then, for example, PVD is performed to deposit iridium oxide ($IrO_2$) with a thickness of 250 nm on the dielectric film 102. This forms a conductive film 103.

Figure 7A:
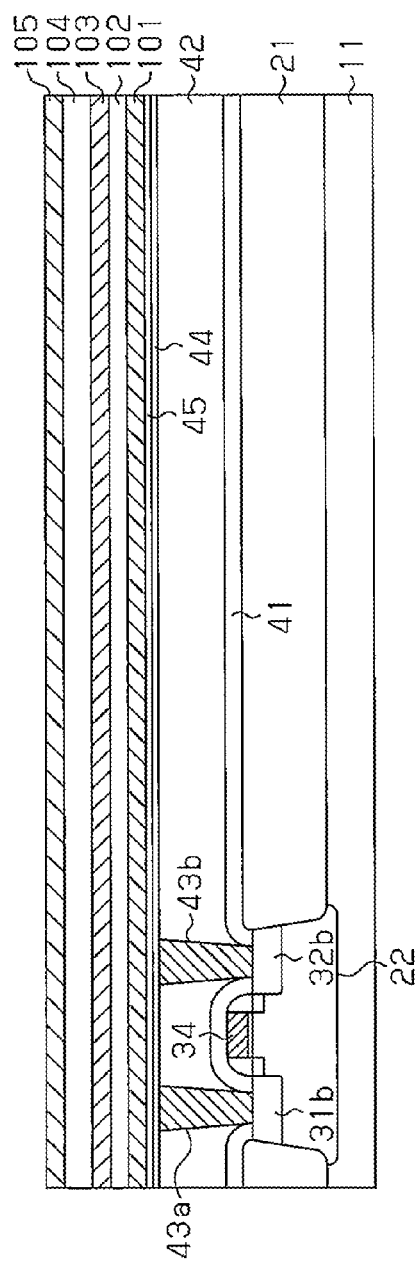

The process performed to obtain the structure of FIG. 7A will now be described.

After forming the conductive film 103 as described above, for example, PVD is performed to deposit PLCSZT on the conductive film 103 and form a dielectric film 104. The dielectric film 104 has a thickness of, for example, 140 nm that is set in accordance with the characteristics of the ferroelectric capacitor 60a illustrated in FIG. 2B.

Subsequently, RTA is performed under an atmosphere containing oxygen to crystalize the dielectric film 104. For example, PVD is performed to deposit iridium oxide ($IrO_2$) with a thickness of 150 nm on the dielectric film 104. This forms a conductive film 105.

In this manner, after forming the anti-oxidation film 44 and the protection film 45 on the flattened interlayer insulation film 42, the conductive film 101, the dielectric film 102, the conductive film 103, the dielectric film 104, and the conductive film 105 are stacked in this order on the protection film 45. Protuberances and etching residues adversely affect the crystal characteristics of the dielectric films 102 and 104. Accordingly, the flatness of the interlayer insulation film 42 allows the dielectric films 102 and 104 to be formed with satisfactory crystal characteristics.

Figure 7B:
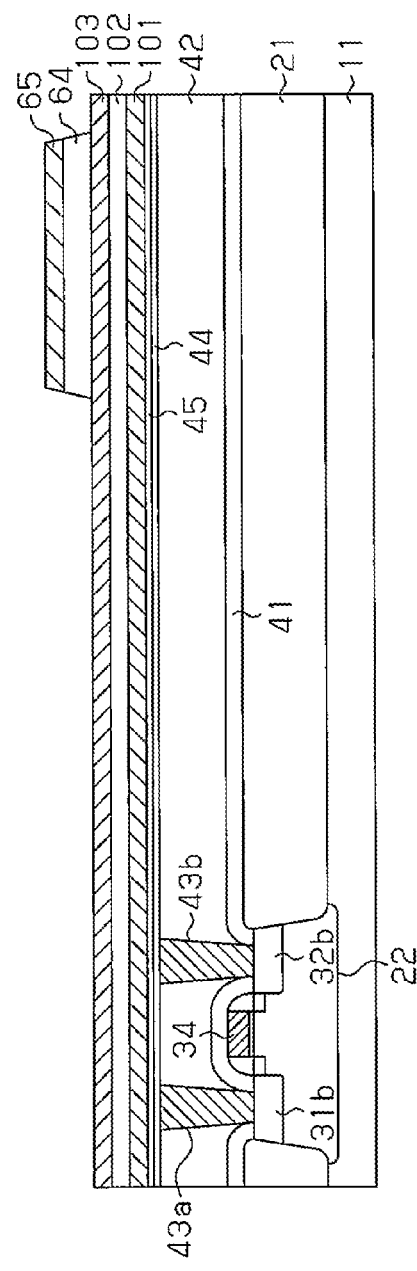

The process performed to obtain the structure of FIG. 7B will now be described.

The conductive film 105 and the dielectric film 104, which are formed as described above, are etched back to form the third electrode 65 and the second dielectric 64.

For example, photolithography is performed to form a resist film that covers a given region of the conductive film 105. Then, using the resist film as a mask, the conductive film 105 and the dielectric film 104 are patterned to form the third electrode 65 and the second dielectric 64. Then, the remaining resist film is removed from the conductive film 105.

Then, referring to FIG. 8A, the conductive film 103, the dielectric film 102, and the conductive film 101 are etched back to form the upper electrode 53, the ferroelectric 52, and the lower electrode 51. In the same manner, the conductive film 103, the dielectric film 102, and the conductive film 101 are etched back to form the second electrode 63, the first dielectric 62, and the first electrode 61.

For example, photolithography is performed to form a resist film that covers a given region of the conductive film 103. Using the resist film as a mask, the conductive film 103 is etched to form the upper electrode 53 and the second electrode 63. Then, the remaining resist film is removed from the conductive film 103.

Further, photolithography is performed to form a resist film that covers a given region of the dielectric film 102. Using the resist film as a mask, the dielectric film 102 is etched to form the ferroelectric 52 and the first dielectric 62. Then, the remaining resist film is removed from the dielectric film 102.

Photolithography is performed to form a resist film that covers a given region of the conductive film 101. Using the resist film as a mask, the conductive film 101 is etched to form the lower electrode 51 and the first electrode 61. Then, the remaining resist film is removed from the conductive film 101.

Subsequently, the semiconductor substrate 11 is set in a heating furnace to perform a heat treatment. For example, the heat treatment is performed under the condition in which the flow rate of the oxygen supplied into the heating furnace is 20 liters per minute, the temperature is 650° C., and the processing time is 40 minutes. The heat treatment restores the characteristics of the ferroelectric 52 and the first and second dielectrics 62 and 64 that have deteriorated during processing. The heat treatment performed to restore the characteristics of the dielectric is referred to as restoration annealing. In this manner, the cell capacitor 50 is formed including the lower electrode 51, the ferroelectric 52, and the upper electrode 53. In the same manner, the ferroelectric capacitors 60a and 60b are formed including the first electrode 61, the first dielectric 62, the second electrode 63, the second dielectric 64, and the third electrode 65.

The process performed to obtain the structure of FIG. 8B will now be described.

First, the protection film 71 is formed entirely on the upper side of the semiconductor substrate 11. The protection film 71 is an alumina film having a thickness of, for example, 20 nm. The cell capacitor 50 and the capacitor cell 60 are covered by the protection film 71.

Then, the interlayer insulation film 72 is formed entirely on the upper side of the semiconductor substrate 11. For example, plasma CVD is performed to deposit TEOS-NSG having a thickness of 1500 nm. This forms the interlayer insulation film 72. Then, CMP is performed to flatten the upper surface of the interlayer insulation film 72.

Referring to FIG. 9A, contact holes 121a and 121b are formed extending from the upper surface of the interlayer insulation film 72 to the impurity regions 31b and 32b of the transistor 30. In the same manner, contact holes 121c and 121d are formed extending from the upper surface of the interlayer insulation film 72 to the upper electrode 53 and the lower electrode 51 of the cell capacitor 50. Further, contact holes 121e and 121f are formed extending from the upper surface of the interlayer insulation film 72 to the second electrode 63 and the third electrode 65 of the capacitor cell 60. For example, photolithography is performed to form a resist film, and the interlayer insulation film 72 is etched using the resist film as an etching mask to form the contact holes 121a to 121f.

The process performed to obtain the structure of FIG. 9B will now be described.

The walls of the contact holes 121a to 121f are each covered by a barrier film. For example, sputtering is performed to form a barrier film entirely on the upper surface of the semiconductor substrate 11. The barrier film has a double-layer structure including, for example, a titanium (Ti) layer having a thickness of, for example, 30 nm and a titanium nitride (TiN) layer having a thickness of, for example, 20 nm.

Then, CVD is performed to deposit tungsten entirely on the upper surface of the semiconductor substrate 11 and fill the contact holes 121a to 121f with tungsten. Subsequently, CMP is performed to remove the tungsten and the barrier film from the interlayer insulation film 72 and expose the interlayer insulation film 72. This forms the conductive plugs 73a to 73f.

Subsequently, a first TiN layer, either one of aluminum (Al) and an Al alloy layer, and a second TiN layer are stacked from below in this order to form a conductive film entirely on the upper surface of the semiconductor substrate 11. The conductive film has a triple layer structure. The first TiN layer (lower layer) has a thickness of, for example, 50 nm. The Al or Al alloy layer has a thickness of, for example, 360 nm, and the second TiN layer (upper layer) has a thickness of, for example, 70 nm. Then, photolithography and etching are performed to pattern the conductive film and obtain the wires 74a to 74e that are electrically connected to the conductive plugs 73a to 73f.

The present embodiment has the advantages described below.

(1) The capacitor cell 60 included in the capacitor element units 15 and 16 functions as a ferroelectric capacitor 60a due to the second dielectric 64, which is located between the second electrode 63 and the third electrode 65. This easily obtains the capacitor cell 60 that has a large capacitance.

(2) The second dielectric 64 of the capacitor cell 60 is formed by patterning the dielectric film 104 on the conductive film 103, which is used to form the upper electrode 53 included in the cell capacitor 50 of the memory cell MC. Accordingly, the thickness of the second dielectric 64 may be set to differ from the thickness of the ferroelectric 52 in the cell capacitor 50. Thus, the capacitor cell 60 may be obtained with a high withstanding voltage. Further, the thickness of the ferroelectric 52 is reduced in the cell capacitor 50. This allows the memory cell MC to be applicable to low voltage operations.

(3) The second dielectric 64 of the capacitor cell 60 is formed by patterning the dielectric film 104 on the conductive film 103, which is used to form the upper electrode 53 included in the cell capacitor 50 of the memory cell MC. Accordingly, the material of the second dielectric 64 may differ from the material of the ferroelectric 52 in the cell capacitor 50. Thus, the capacitor cell 60 may be designed with a high degree of freedom.

(4) The conductive film 101, the dielectric film 102, the conductive film 103, the dielectric film 104, and the conductive film 105 are formed on the interlayer insulation film 42, which has a flattened upper surface. Accordingly, the films 101 to 105 are formed having satisfactory crystal characteristics without being affected by protuberances or the like. Further, the films 101 to 105 are formed on the interlayer insulation film 42, which has a flattened upper surface. Thus, each film is free from ridges and valleys that would result from etching residues. Accordingly, the films 101 to 105 may easily be formed with the desired thickness.

(5) The second dielectric 64 of the capacitor cell 60 is formed by patterning the dielectric film 104 on the conductive film 103, which is used to form the upper electrode 53 included in the cell capacitor 50 of the memory cell MC. Accordingly, the second dielectric 64 and the ferroelectric 52 of the cell capacitor 50 may be formed from the same material. This allows the second dielectric 64 and the ferroelectric 52 to be produced in the same process and increase the degree of freedom for designing the capacitor cell 60.

(6) The first electrode 61, the first dielectric 62, and the second electrode 63 of the capacitor cell 60 and the lower electrode 51, the ferroelectric 52, and the upper electrode 53 of the cell capacitor 50 are formed by patterning the conductive film 101, the dielectric film 102, and the conductive film 103, which are formed in the interlayer insulation film 42. Accordingly, the first electrode 61, the first dielectric 62, and the second electrode 63 of the capacitor cell 60 may be formed simultaneously with the lower electrode 51, the ferroelectric 52, and the upper electrode 53 of the cell capacitor 50. Thus, the capacitor cell 60 and the cell capacitor 50 may be formed without increasing patterning steps.

It should be apparent to those skilled in the art that the above embodiment may be embodied in many other specific forms without departing from the scope of the invention. Particularly, it should be understood that the above embodiment may be embodied in the following forms.

In the above embodiment, the structure for connecting conductive plugs to the first and second electrodes 61 and 63 of the capacitor cell 60 may be changed.

Figure 10:
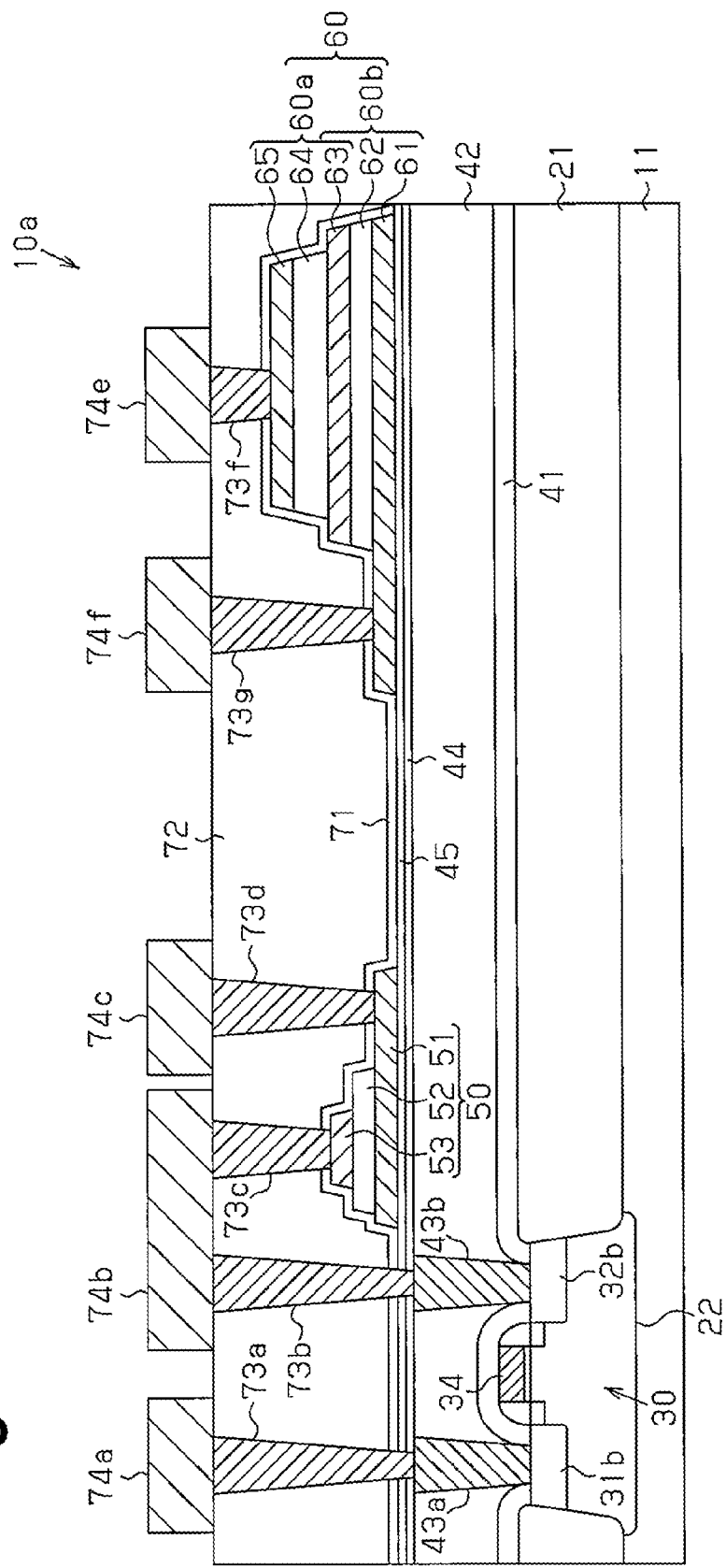
FIG. 10 is a schematic cross-sectional view of a further semiconductor device.

For example, referring to FIG. 10, a semiconductor device 10a may include a conductive plug 73g that extends from the upper surface of the interlayer insulation film 72 to the first electrode 61 of the capacitor cell 60. The conductive plug 73g is electrically connected to the wire 74f, which is formed on the interlayer insulation film 72. In FIG. 10, the conductive plug 73e and the wire 74d, which are illustrated in FIG. 3, are not formed.

FIGS. 11A and 11B are circuit diagrams of the semiconductor device 10a illustrated in FIG. 10. The memory cell MC illustrated in FIG. 11A is similar to that of FIG. 2A and thus will not be described.

As illustrated in FIG. 11B, the capacitor cell 60 of the semiconductor device 10a includes two ferroelectric capacitors 60a and 60b. The ferroelectric capacitors 60a and 60b are connected in series between the wire 74e and the wire 74f. The wire 74e is a power line that supplies, for example, low potential voltage to the memory unit 14 and the logic units 12 and 13 illustrated in FIG. 1. The wire 74f is a power line that supplies, for example, high potential voltage to the memory unit 14 and the logic units 12 and 13 illustrated in FIG. 1. Accordingly, in the capacitor cell 60, each of the two ferroelectric capacitors 60a and 60b connected between the wires 74e and 74f functions as a smoothing capacitor that stabilizes the high potential voltage and the low potential voltage supplied to the memory unit 14 and the logic units 12 and 13.

Figure 12:
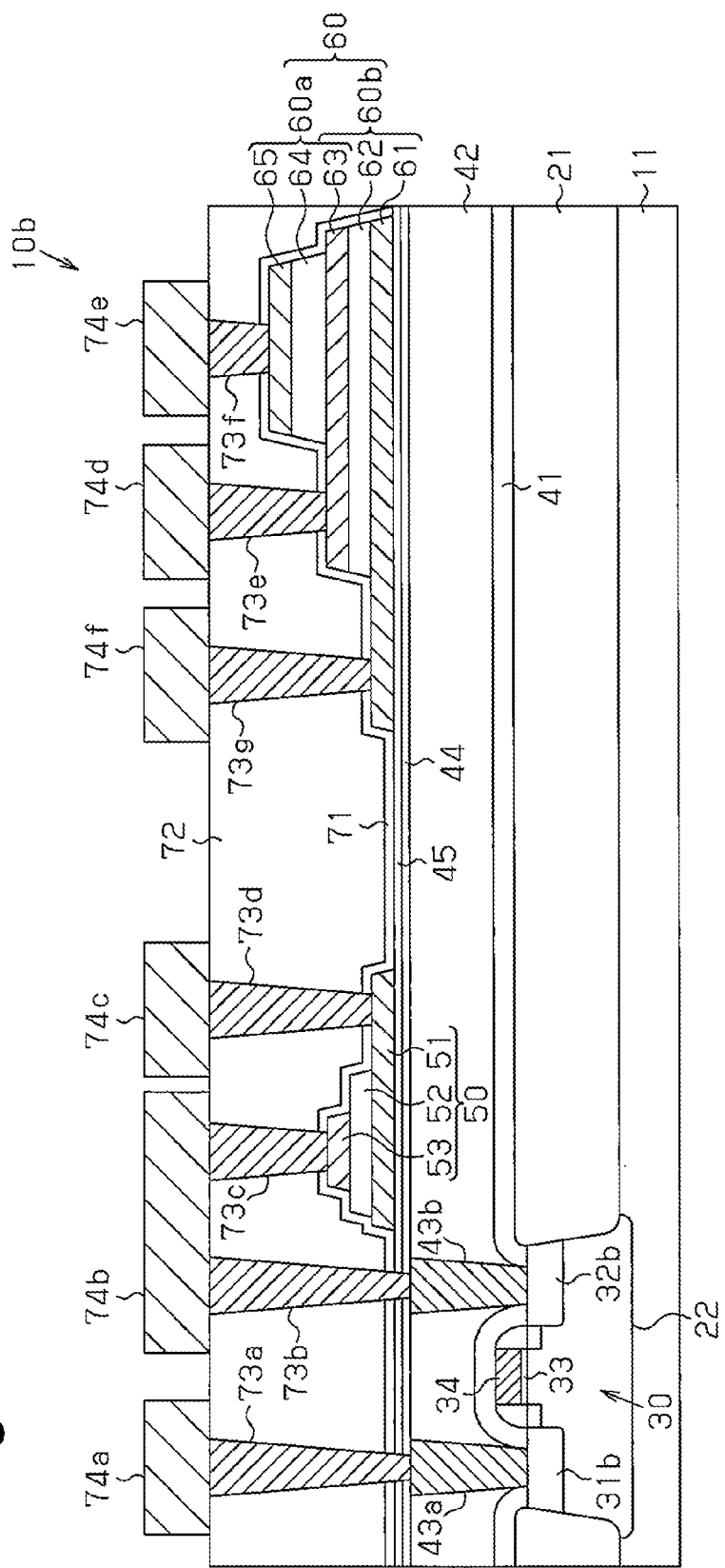
FIG. 12 is a schematic cross-sectional view of a further semiconductor device.

Referring to FIG. 12, a semiconductor device 10b includes the conductive plug 73g, which extends from the upper surface of the interlayer insulation film 72 to the first electrode 61 of the capacitor cell 60, and the conductive plug 73e, which extends from the upper surface of the interlayer insulation film 72 to the second electrode 63 of the capacitor cell 60. The conductive plug 73g is electrically connected to the wire 74f formed on the interlayer insulation film 72. The conductive plug 73e is electrically connected to the wire 74d formed in the interlayer insulation film 72.

Figure 14A:
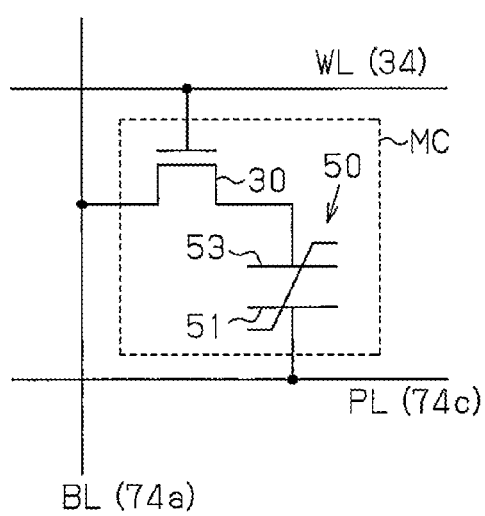
FIG. 14A is a circuit diagram of a memory cell in the semiconductor device of FIG. 12.
Figure 14B:
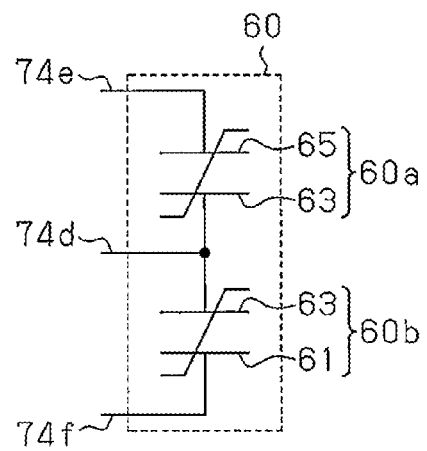
FIG. 14B is a circuit diagram of a capacitor cell in the semiconductor device of FIG. 12.

FIGS. 14A and 14B are circuit diagrams of the semiconductor device 10b illustrated in FIG. 10. The memory cell MC illustrated in FIG. 14A is similar to that of FIG. 2A and thus will not be described.

Referring to FIG. 14B, the capacitor cell 60 of the semiconductor device 10b includes two ferroelectric capacitors 60a and 60b. The wire 74e, which is connected to the third electrode 65 of the ferroelectric capacitor 60a is a power line that supplies, for example, low potential voltage to the memory unit 14 and the logic units 12 and 13 illustrated in FIG. 1. Further, the wire 74d, which is connected to the second electrode 63 shared by the ferroelectric capacitors 60a and 60b, is a power line that supplies, for example, high potential voltage to the memory unit 14 and the logic units 12 and 13 illustrated in FIG. 1. The wire 74f, which is connected to the first electrode 61 of the ferroelectric capacitor 60b, is a power line that supplies, for example, low potential voltage to the memory unit 14 and the logic units 12 and 13 illustrated in FIG. 1. Accordingly, in the capacitor cell 60, each of the two ferroelectric capacitors 60a and 60b functions as a smoothing capacitor that stabilizes the high potential voltage, which is supplied by the wire 74d to the memory unit 14 and the like, and the low potential voltage, which is supplied by the wires 74e and 74f to the memory unit 14 and the like.

Figure 13:
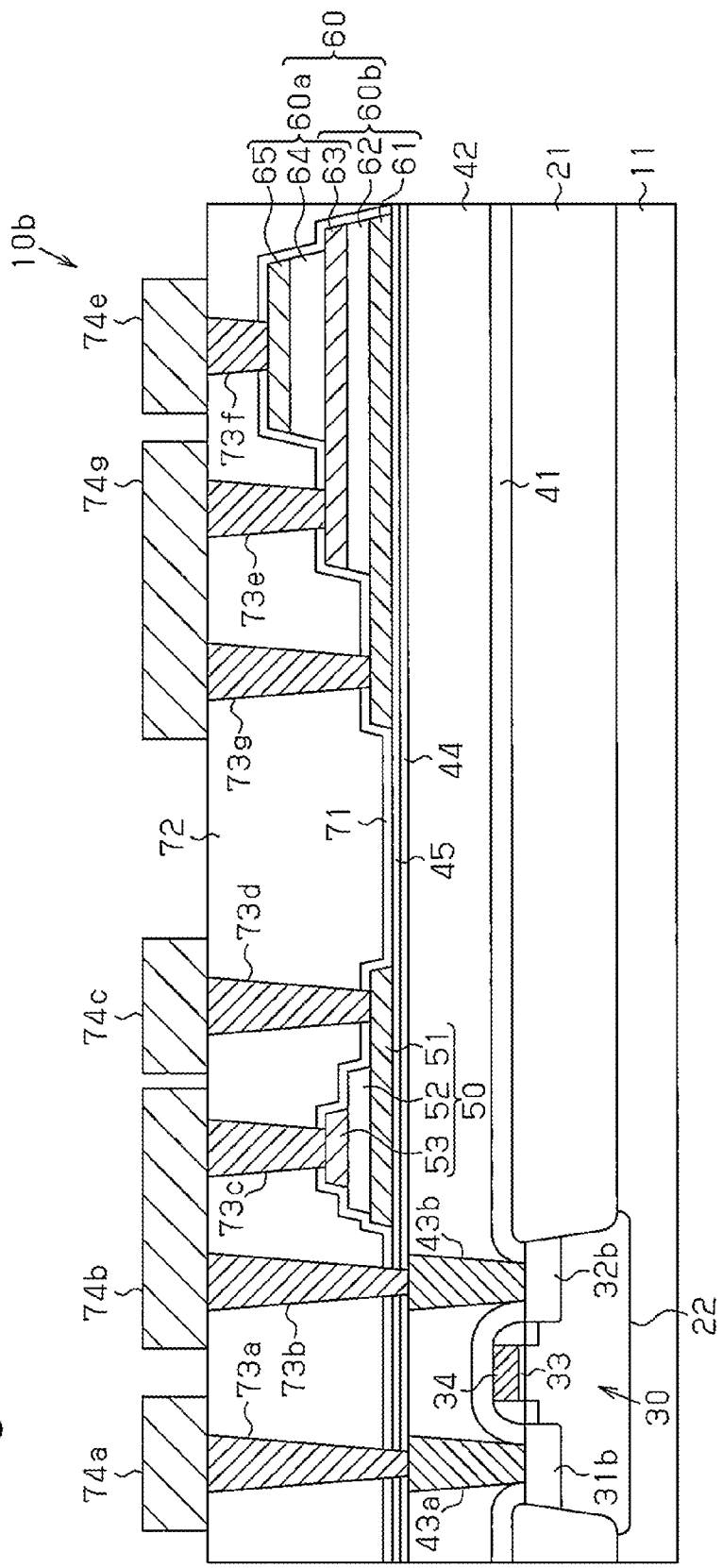
FIG. 13 is a schematic cross-sectional view of a further semiconductor device.

FIG. 13 illustrates a modified example of the structure illustrated in FIG. 12. As illustrated in FIG. 13, a wire 74g is formed on the interlayer insulation film 72. The wire 74g may electrically connect the conductive plug 73e and the conductive plug 73g to each other. This electrically connects the first electrode 61 and the second electrode 63 to each other in the capacitor cell 60.

Figure 15A:
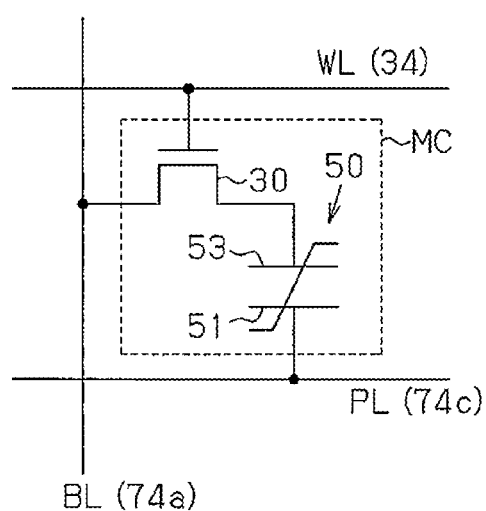
FIG. 15A is a circuit diagram of a memory cell in the semiconductor device of FIG. 13.
Figure 15B:
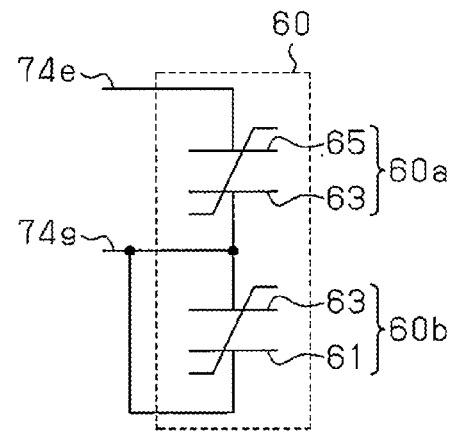
FIG. 15B is a circuit diagram of a capacitor cell in the semiconductor device of FIG. 13.

FIGS. 15A and 15B are circuit diagrams of the semiconductor device 10b illustrated in FIG. 13. The memory cell MC illustrated in FIG. 15A is similar to that of FIG. 2A and thus will not be described.

Referring to FIG. 15B, the wire 74g connects the first and second electrodes 61 and 63 to each other in the ferroelectric capacitor 60b. Accordingly, the potential at the first electrode 61 does not float. This eliminates the influence on the capacitance of the ferroelectric capacitor 60b and allows for accurate usage of the capacitor component of the ferroelectric capacitor 60a.

In this case, the wire 74g may be a power line that supplies high potential voltage to, for example, the memory unit 14 and the logic units 12 and 13 illustrated in FIG. 1. As a result, the capacitor cell 60 functions as a smoothing capacitor that stabilizes high potential voltage and low potential voltage with the capacitance component of the ferroelectric capacitor 60a.

In the foregoing description, each of the semiconductor devices 10, 10a, and 10b includes a planar type ferroelectric memory in which the lower electrode 51 and the upper electrode 53 of the cell capacitor 50 have connections located above the electrodes 51 and 53. However, the structure of the capacitor cell 60 in each of the above embodiments may be applied to a semiconductor device including a stacked type ferroelectric memory in which the lower electrode 51 of the cell capacitor 50 has a connection located below the lower electrode 51.

Figure 16:
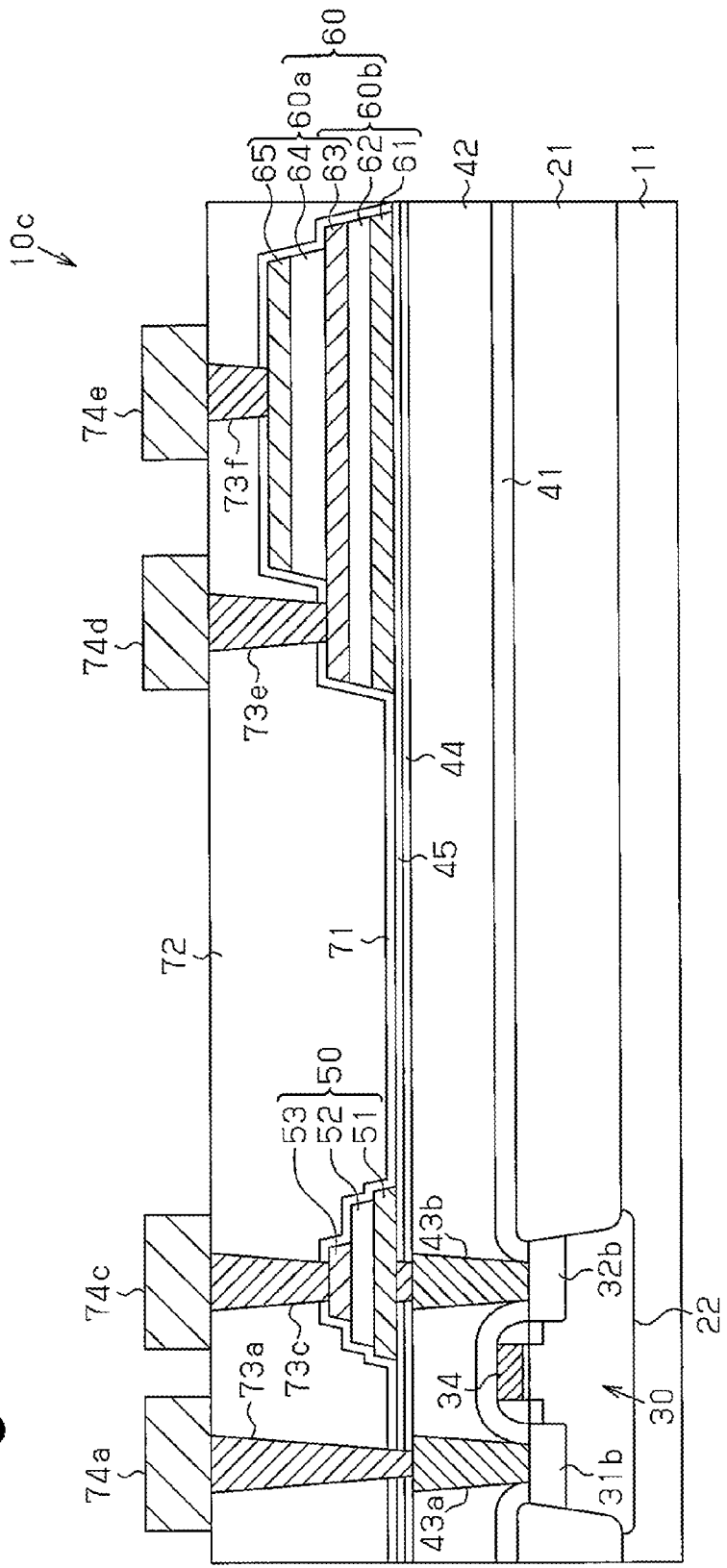
FIG. 16 is a schematic cross-sectional view of a further semiconductor device.

For example, as illustrated in FIG. 16, in a semiconductor device 10c, the conductive plug 43b, which is connected to the impurity region 32b of the transistor 30, is electrically connected to the lower electrode 51 of the cell capacitor 50. In such a semiconductor device including a stacked type ferroelectric memory, the area of the semiconductor device may be smaller than a semiconductor device including a planar type ferroelectric memory.

In the capacitor cell 60 illustrated in FIG. 16, a conductive plug electrically connected to the first electrode 61 may be formed in the interlayer insulation film 42. Further, the conductive plug may be connected to a power line or a transistor.

Changes may be made to the steps that form a conductive film and a ferroelectric film by etching back the conductive film and the ferroelectric film. For example, in the step that obtains the structure illustrated in FIG. 7B, the third electrode 65 and the second dielectric 64 may be formed using different resist films as masks.

The heat treatment (restoration annealing) performed to restore the characteristics of the ferroelectric 52, the first and second dielectrics 62 and 64 may be performed after forming the protection film 71 illustrated in FIG. 8B.

The capacitor cell 60 may be used for an application other than a smoothing capacitor.

In the above embodiments, the ferroelectric film including a perovskite structure and ferroelectric characteristics is not limited to a PLCSZT film. For example, a $Pb(Zr,Ti)O_3$ film (PZT film) may be used. Further, a $(Pb,La)(Zr,Ti)O_3$ film (PLZT film) in which PZT is doped with La may be used. A (Pb,Ca)(Zr,Ti)O$_3$ film (PCZT film) doped with Ca may be used. A (Pb,Sr)(Zr,Ti)O$_3$ film (PSZT film) doped with Sr may be used. Further, a (Pb,La,Ca)(Zr,Ti)O$_3$ film (PLCZT film) doped with La and Ca may be used. A (Pb,La,Sr)(Zr,Ti)O$_3$ film (PLSZT film) doped with La and Sr may be used. Also, a (Pb,Ca,Sr)(Zr,Ti)O$_3$ film (PCSZT film) doped with Ca and Sr may be used.

It is preferred that the material included in a ferroelectric film be selected from, for example, lead (Pb), zirconium (Zr), titanium (Ti), lanthanum (La), strontium (Sr), calcium (Ca), niobium (Nb), manganese (Mn), nickel (Ni), and ruthenium (Ru).

In the above embodiment, alumina (Al$_x$O$_y$), titanium oxide (TiOx), silicon oxide (SiOx), silicon nitride (SixNy), or the like may be used as the material of the second dielectric 64. In this manner, the second dielectric 64 is not limited to a ferroelectric material.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments of the present invention have been described in detail, it should be understood that various changes, substitutions, and alterations could be made hereto without departing from the spirit and scope of the invention.

The invention claimed is:

1. A semiconductor device comprising:
   a semiconductor substrate;
   a transistor including an impurity region formed in the semiconductor substrate, a gate insulation film located on the semiconductor substrate, and a gate electrode located on the gate insulation film;
   a first insulation film formed above the semiconductor substrate;
   a first capacitor located on the first insulation film, wherein the first capacitor includes a lower electrode, a ferroelectric, and an upper electrode, and one of the lower electrode and the upper electrode is electrically connected to the impurity region so that the transistor and the first capacitor form a memory cell; and
   a second capacitor located on the first insulation film, wherein the second capacitor includes a first electrode, a first dielectric, a second electrode, a second dielectric, and a third electrode, and the transistor and the second capacitor are in an electrically independent state;
   wherein the lower electrode and the first electrode are formed from the same material, the ferroelectric and the first dielectric are formed from the same material, and the upper electrode and the second electrode are formed from the same material.

2. The semiconductor device according to claim 1, further comprising:
   a second insulation film that covers the first capacitor and the second capacitor;
   a first conductive plug that extends through the second insulation film, wherein the first conductive plug is connected to the third electrode; and
   a second conductive plug that extends through the second insulation film, wherein the second conductive plug is connected to one of the first electrode and the second electrode.

3. The semiconductor device according to claim 2, further comprising a third conductive plug that extends through the second insulation film, wherein the third conductive plug is connected to the other one of the first electrode and the second electrode.

4. The semiconductor device according to claim 3, further comprising a wire located on the second insulation film, wherein the wire connects the first electrode and the second electrode to each other through the second conductive plug and the third conductive plug.

5. The semiconductor device according to claim 1, wherein the second dielectric is thicker than the first dielectric.

6. The semiconductor device according to claim 1, wherein the lower electrode and the first electrode have the same thickness, the ferroelectric and the first dielectric have the same thickness, and the upper electrode and the second electrode have the same thickness.

7. The semiconductor device according to claim 1, wherein the ferroelectric of the first capacitor and the first dielectric of the second capacitor are each a ferroelectric including a perovskite structure.

8. The semiconductor device according to claim 7, wherein the second dielectric of the second capacitor is a ferroelectric including a perovskite structure.

9. A method for manufacturing a semiconductor device, the method comprising:
   forming a transistor in a semiconductor substrate;
   forming a first insulation film above the semiconductor substrate, wherein the forming a first insulation film includes flattening an upper surface of the first insulation film;
   forming a first conductive film on the first insulation film;
   forming a first dielectric film on the first conductive film;
   forming a second conductive film on the first dielectric film;
   forming a second dielectric film on the second conductive film;
   forming a third conductive film on the second dielectric film;
   patterning the third conductive film to form a first electrode of a first capacitor;
   patterning the second dielectric film to form a first dielectric of the first capacitor;
   patterning the second conductive film to form an upper electrode of a second capacitor and a second electrode of the first capacitor;
   patterning the first dielectric film to form a ferroelectric of the second capacitor and a second dielectric of the first capacitor; and
   patterning the first conductive film to form a lower electrode of the second capacitor and a third electrode of the first capacitor, wherein
   the second capacitor and the transistor are electrically connected to each other to form a memory cell, and
   the first capacitor and the transistor are in an electrically independent state.

10. The method according to claim 9, wherein
    the first dielectric film is a ferroelectric film including a perovskite structure, and
    the method further comprises performing a heat treatment after forming the third electrode.

* * * * *